US006472804B2

United States Patent
Mueller et al.

(10) Patent No.: US 6,472,804 B2
(45) Date of Patent: *Oct. 29, 2002

(54) ELECTRODE FOR USE IN ELECTRO-OPTICAL DEVICES

(75) Inventors: Peter Mueller, Zurich; Walter Riess, Adliswil, both of (CH)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/340,005

(22) Filed: Jun. 25, 1999

(65) Prior Publication Data

US 2002/0130605 A1 Sep. 19, 2002

(30) Foreign Application Priority Data

Jul. 4, 1998 (EP) .............................. 98112379

(51) Int. Cl.$^7$ .............................. H01J 1/00; H01K 1/02
(52) U.S. Cl. ................... 313/326; 313/505; 313/517
(58) Field of Search ................. 313/326, 504, 313/505, 510, 517

(56) References Cited

U.S. PATENT DOCUMENTS

| | | | |
|---|---|---|---|
| 3,892,471 A | * 7/1975 | Biermann et al. | 349/142 |
| 4,518,891 A | 5/1985 | Howard, Jr. | 313/398 |
| 5,034,068 A | 7/1991 | Glenn et al. | 136/256 |
| 5,131,065 A | 7/1992 | Briggs et al. | 385/120 |
| 5,293,546 A | 3/1994 | Tadros et al. | 359/269 |
| 5,445,899 A | 8/1995 | Budzilek | 428/690 |

FOREIGN PATENT DOCUMENTS

| | | |
|---|---|---|
| EP | 0 803 551 A2 | 10/1997 |
| JP | 5-21889 | 4/1993 |
| JP | 5-243594 | 9/1993 |
| JP | 11-214163 | 6/1999 |
| WO | WO 79/01025 | 11/1979 |

OTHER PUBLICATIONS

A. Takeoka, et al., "Development and Application of See–Through a–Si Solar Cells," Solar Energy Materials and Solar Cells, vol. 29, No. 3, pp. 243–252 (1993).

(List continued on next page.)

Primary Examiner—Vip Patel
Assistant Examiner—Kevin Quarterman
(74) Attorney, Agent, or Firm—Scully, Scott, Murphy & Presser; Marian Underweiser

(57) ABSTRACT

An electrode for an electro-optical device is provided. Light is passing through this electrode which comprises a pattern of conductive elements. The elements have dimensions small compared to the wavelength of light, so that the electrode appear transparent. The light intensity distribution after having penetrated the electrode compared with the light intensity distribution before having penetrated the electrode is influenced by forward scattering.

12 Claims, 2 Drawing Sheets

OTHER PUBLICATIONS

A.G. Macdiarmid, et al., "Application of Thin Films of Conjugated Polymers in Novel LED's and Liquid Crystal-'Light Valves', " Electrical, Optical, and Magnetic Properties of Organic Solid State Materials III. Symposium, Electrical, Optical, and Magnetics Properties of Organic Solid State Materials III. Symposium, Boston, MA, USA, pp. 3–12 Nov.–Dec. 1995.

D. Routkevitch, et al., "Nonlithographic Nano–Wire Arrays: Fabrication, Physics, and Device Applications," IEEE Transactions on Electron Devices, vol. 43, No. 10, pp. 1646–1658 (1996).

S. Noach, et al., "Microfabrication of an Electroluminescent Polymer Light Emitting Diode Pixel Array," Appl. Phys. Lett., vol. 69, No. 24, pp. 3650–3652 (1996).

H. Okamoto, et al., "Fabrication of a Narrow Gold Wire Using Scanning Tunneling Microscopy," Jpn. J. Appl. Phys., vol. 36, pp. 3832–3833 (1997).

D. Yap, "See–Through, Multi–Pixel Organic Emissive Display," Electronics Letters, vol. 34, No. 9, pp. 915–916 (1998).

Abstract of Japanese Patent Publication No. 05243594 published Sep. 21, 1993.

* cited by examiner

ELECTRODE FOR USE IN ELECTRO-OPTICAL DEVICES

BACKGROUND OF THE INVENTION

TECHNICAL FIELD

The present invention concerns an electrode. More particularly, the invention relates to an electrode for use in electro-optical devices, such as displays or solar cells.

PRIOR ART

Many different kinds of electrodes are known. Various electrodes for electro-optical applications and devices have been reported widely in recent years. Of particular interest is the electrical and optical characteristics of such electrodes.

U.S. Pat. No. 4,518,891 to Howard, Jr. discloses large area electroluminescent (EL) faceplates for a storage cathode ray tube (CRT). It describes a macroscopic metallic mesh to hold the electrical potential constant.

Another metal structure called metal assist structure is disclosed in U.S. Pat. No. 5,455,899 to Budzilek et al., which is related to electroluminescent devices in general.

U.S. Pat. No. 5,131,065 to Briggs et al. discloses an optically enhanced flat display panel. It describes narrow highly conductive strips to obtain low resistance.

U.S. Pat. No. 5,293,564 to Tadros et al. discloses an improved working electrode for use in display devices. This electrode has an oxide coated metal grid. The metal grid and coating are disposed on a transparent substrate which serves to provide structural integrity.

Nevertheless, all reports including the mentioned disclosures are paying for its better conductivity with a lower quality of its optical characteristics. Recently, transparent conducting oxide (TCO) thin films have been widely used as the transparent electrode for flat-panel displays and solar cells. However, the TCO films in practical use for these devices still have several unsolved problems such as high cost, low transparency, and poor conductivity. Highly conductive and transparent undoped or impurity-doped ZnO (Zinc Oxide) or doped AlO (Aluminum Oxide) thin films have recently gained much attention because ZnO is an inexpensive and abundant material. Another disadvantage of the state of the art is that usual electrodes are not absolutely invisible and cover a large portion of an electro-optical device.

An object of the present invention is to overcome the disadvantages of known approaches.

It is an object of the present invention to provide a new electrode for use in electro-optical devices.

It is generally an object of the present invention to improve the electrical and optical properties of an electrode in electro-optical devices.

It is a further object of the present invention to provide an electrode with high conductivity, high transparency and with a wide adaptability.

It is another object of the present invention to provide an electrode with an excellent conductivity-transparency ratio.

It is also an object of the present invention to provide an electrode with highly adaptable electrical, optical, electronic and interface characteristics.

Another object of the present invention is to provide an improved display device with the new electrode which is characterized by high transmittance and improved uniformity.

SUMMARY OF THE INVENTION

The present invention provides an electrode for an electro-optical device. Light is passing through the electrode and the electrode comprises a pattern of conductive elements. The elements have dimensions small compared to the wavelength $\lambda$ of light, which means the elements comprise a perimeter p smaller than the wavelength $\lambda$ of the passing light. The elements may have any kind of structure and the word perimeter herein used is meant to cover any kind of size or shape suited to design a transparent electrode.

The electrode is penetrable by light, comprises longitudinal electrically conductive elements and spaces, whereby the light intensity distribution after having penetrated the electrode compared with the light intensity distribution before having penetrated the electrode is influenced by dominant forward scattering. According to the present invention, more forward scattering than backward scattering is achievable, which means that the transmission loss is less than the surface coverage.

Due to the small geometry of the elements, which can be straps or spheres or combinations thereof, Mie scattering occurs, making the electrode appear transparent for a certain wavelength range. It is an advantage of the present invention that the transparency of such an electrode is very high, because some incidence of light on the small elements will be forward scattered and no longer reflected backwards as aforementioned. The total percentage of coverage caused by conductive elements is low and the power distribution is very high compared to today's solutions. The present invention provides the ability to make displays and all other electro-optical devices with better performance. In the following the electrode according to the present invention will also be referred to as transparent electrode.

The elements comprise a suited material, such as metal, an alloy, semiconductor or a conductive polymer to guarantee for a good conductivity. It should be noted that the word electrode herein used is meant to cover the conductive elements and the spaces, because the spaces together with the conductive elements influence the electrode's properties. Furthermore, the conductive are arranged in form of a regular pattern or structure and have a size and a geometry which might determine the direction of the light. The geometry of the electrode, that means the pattern of conductive elements is highly application specific. For instance, optical effects like polarization and viewing angle adjustments are achievable. An enhancement will be achieved if the electrode is designed appropriately. The redundancy of the structure of the elements, which will electrically compensate broken elements or straps, is a huge advantage for every production process.

The conductive elements of the inventive electrode has a surface coverage of about 1% to 20% and preferably less than 11% or even less than 6%. Because of the forward scattered light, the loss of light will be less than the values mentioned before. This will provide more transparency compared to common electrodes. Less energy is necessary and therefore portable battery-powered applications can be used for a longer time.

A resistance of about 0.01 $\Omega/\square$ to 100 $\Omega/\square$, preferably less than 1 $\Omega/\square$, can be achieved. For purposes of the present invention the term "ohms per square ($\Omega/\square$)" is used to designate sheet resistivity over a given surface area in a conventional manner.

The electrode has a topside modifier and a backside modifier. In the following, topside modifier and backside modifier together will be called modifiers. The modifiers are optional. The modifiers can be built of any suited material. Their structure depends on the application. It is an advantage of the electrode according to the present invention that modifier(s) can be employed. For example the modifiers are made of $SiO_x$ which can have protecting functions; or the modifiers itself may be bragg-mirrors to enhance optical characteristics; or the modifiers can have the function of injection electrodes to inject excitons into a semiconductor; or the modifiers can act as a unification layer to planarize the surface of the electrode; or the modifiers can be used to build cavities into the structure openings.

The electrode can be manufactured using for example one of the following techniques: the so called microcontact printing or processing, photolithography, thermal evaporation, sputtering, coating and etching techniques. Submicron lithography can be achieved by the known VIS/UV light lithography, by X-ray lithography and e-beam lithography, and by scanning probe techniques and related techniques. A general advantage of the transparent electrode is the possibility of its preprocessability without any application specific structures, which is a result of the structure of the transparent electrode. This brings the advantage of less expensive processing steps and the possibility to manufacture the transparent electrode as a semi-finished product for example on glass or synthetic materials.

The transparent electrode is particularly suited for electro-optical applications and devices. The excellent conductivity-transparency ratio has its roots in the small dimensions of the conducting structure, which can be a regular grid. The perimeter of the conductive elements are small compared to the wavelength of the light. Thus, the optical distortions can be minimized and the electrode itself gets invisible and transparent. Moreover, the small dimensions cause into partial forward scattering of light. The forward scattering of light leads to a higher transmission rate of the transparent electrode.

The electrode according to the present invention is usually part of an electro-optical device that emits light, as there are: lasers, lamps, cell phones, pagers, alarm clocks, digital watches, radios, personal digital assistants, television sets or flat panel TV displays, information display terminals, flat-panel displays and any kind of displays or devices with an organic (polymer and molecular) light emitting diode (OLED) technology, e.g. for use in notebook displays, shop windows, car windows or car displays, toys, credit cards, small cellular phones, large flat screen high definition televisions and so on. Organic electroluminescent device and OLED technology has been determined to potentially provide outstanding display performance through high light emitting efficiency, which means high brightness and excellent luminosity, high resolution, full color capability, low power and long operating life.

The electrode which is electrically conductive and optically transparent may substitute indium-tin-oxide (ITO) for transparent electrodes in electro-optical devices.

Furthermore, the electrode according to the present invention is a conductor or a conductor element, which means that the transparent electrode is executed as a lead. This might be an invisible lead to a device in or on a shop window or a car window, for instance, for an alarm signal which is displayed on the window. However, the transparent electrode may be used as a conductor or as a conductor element wherever an invisible lead or conductor on a transparent medium is required or desired.

The electrode is not only suited for electro-optical applications but also for optical applications and devices. A window or a glass front of buildings or offices with such a transparent electrode makes it more bright in the inside. As part of a light emitting device, the transparent electrode provides a higher-light efficiency and helps therefore to save energy.

The electrode according to the present invention might also be part of an electro-optical device that receives light. This might be solar cells or photodetectors, like photodiodes, photoresistors, and phototransistors. The optical transmission coefficient will be improved for such devices and the internal resistance becomes smaller. With the present invention the efficiency of solar cells and other devices will be enhanced dramatically.

DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENTS OF THE INVENTION

Figure 1:
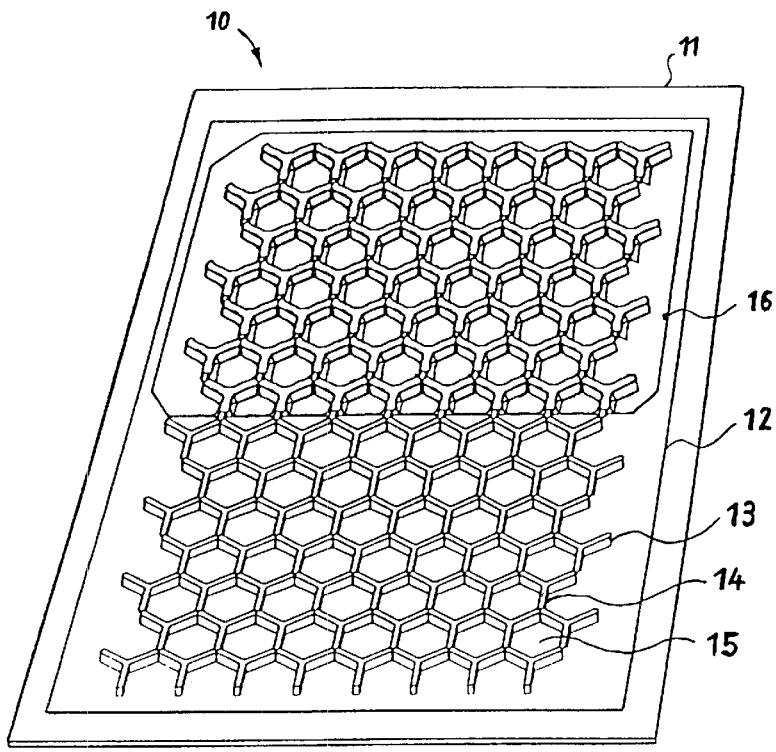
FIG. 1 is a schematic 3-dimensional top-view of a substrate with a pattern of conductive elements, in accordance with the present invention.

Before embodiments of the present invention are described, the basic elements, in accordance with the present invention, are addressed.

Electrode

An electrode is a component of an electric circuit that connects the conventional wiring of a circuit to a conducting medium. The electrically positive electrode is called the anode and the negative electrode is called the cathode. As aforementioned the electrode of the present invention includes conductive elements and spaces between the conductive elements.

The Mie Effect

The Mie theory for a sphere provides the only practical method for calculating light-scattering properties of finite particles of arbitrary size and refraction index. The scattering theory does provide also a first-order description of optical effects in nonspherical particles, and it correctly describes many small-particle effects that are not intuitively obvious.

Excluding the case where the conductivity or the dielectric constant is very large (in which case most of the incident light is radiated in the backward direction, i.e. "reflected"), the polar diagrams for the scattering of linearly polarized light by a spherical gold particle, in the limit of vanishingly small spheres ($R \rightarrow 0$), are symmetrical about the plane through the center of the sphere, at right angles to the direction of propagation of the incident light. There is an intensity maximum in the forward direction and in the reverse direction, and there is a minimum in the plane of symmetry. As the radius of the sphere is increased there is a departure from symmetry, more light being scattered in the forward direction than in the opposite direction. As the radius is increased still further practically all the scattered light appears around the forward direction; likewise for a conducting sphere there is a greater concentration of light in this direction. When the radius of the sphere is very large compared to the wavelength most of the incident light is reflected. Born M. and Wolf E. describes in their book "Principles of Optics" the optics of metals including the theory of Mie. Bohren C. and Huffman D. describes in the book "Absorption and Scattering of Light by Small Particles" conductive particles which are small compared to the wavelength of light. The forward scattering effect may occur during night driving in fog or with a dirty windshield. Light from oncoming automobile headlights is scattered in the forward direction by fog droplets or particles to produce bothersome glare.

Display Technologies

A display is an electro-optical device to make data or images appear on a monitor or on a front-end device. A display screen is therefore a display part of a monitor. Most display screens work under the same principle as a television, using a cathode ray tube (CRT). Flat-panel displays are thin display screens used in portable computers and work differently. Nearly all modern flat-panel displays use LCD, abbreviation of liquid crystal display, technologies. LCD displays utilize two sheets of polarizing material with a liquid crystal solution between them. An electric current passing through the liquid causes the crystals to align so that light cannot pass through them. Each crystal, therefore, is like a shutter, either allowing light to pass through or blocking the light. Monochrome LCD images usually appear as blue or dark gray images on top of a grayish-white background. Color LCD displays use two basic techniques for producing color: Passive matrix is the less expensive of the two technologies. The other technology, called thin film transistor (TFT) or active-matrix, produces color images that are as sharp as traditional CRT displays. TFT-based displays are also LCD displays, in which the screen is refreshed more frequently than in conventional passive-matrix displays and in which each pixel is controlled by one to four transistors. The TFT technology provides the best resolution of all the flat-panel techniques, but it is also the most expensive. Recent passive-matrix displays use new CSTN (color super-twist nematic) and DSTN (double-layer supertwist nematic) technologies and produce sharp colors rivaling active-matrix displays.

Most LCD screens are backlit. Backlit is a technique used to make flat-panel displays or notebook computers easier to read in bright environments. A backlit display is illuminated so that the foreground appears sharper in contrast to the background. Other technologies have been the focus of an intense research and development effort as they are suitable for a wide range of photonic applications including flat panel displays, which include active-matrix liquid crystal displays (AMLCD), field emission displays (FED), plasma display panels (PDPs or gas plasma), plasma addressed liquid crystals (PALC), electroluminescent (EL) displays, light emitting polymers (LEP) and organic light emitting devices (OLEDs).

Solar Cell

A solar cell is a photosensitive cell or combination of cells designed to generate voltage by direct conversion of light into electricity when exposed to a source of light. The basic material of a solar cell is silicon (Si), which is extracted from silica sand. Silicon cells can be divided into two main groups depending on how they have been made:

1. Crystalline silicon cells. These are formed as single or multicrystal cells, and offer a high efficiency: fourteen to eighteen per cent. Crystalline silicon cells are used in cladding materials, roofs, skylights etc.

2. Amorphous silicon cells. Amorphous silicon (a-Si) solar cells are relatively inexpensive, and used in consumer applications such as watches and pocket calculators as well as buildings. Amorphous material has a noncrystalline structure in which all of its atoms are arranged irregularly. The efficiency is five to eight percent, but unfortunately the efficiency falls in the first few years of operation. Nevertheless, amorphous solar cells have several advantages over conventional solar cells. For example, they require a smaller amount of silicon and less energy in manufacturing, they can be manufactured by an automated process, and they can be fabricated into cells with a large surface area. Because of these and other features, amorphous solar cells are expected to become very inexpensive in the future.

Semiconductors have interesting electrical properties. One of their properties is that they can be treated in different ways to become either 'positive' (p-type) or 'negative' (n-type). A solar cell consists of two layers of semiconductor, one p-type and the other n-type, sandwiched together to form a 'pn junction'. This pn junction allows to induce an electric field across the device. When particles of light ('photons') are absorbed by the semiconductor, they transfer their energy to some of the semiconductor's electrons, which are then able to move through the material. For each such negatively charged electron, a corresponding positive charge is created a 'hole'. In an ordinary semiconductor, these electrons and holes recombine after a short time and their energy is wasted as heat. In a solar cell, however, the electrons and holes are swept across the pn junction in opposite directions by the action of the electric field. This separation of charge induces a voltage across the device.

Figure 2:
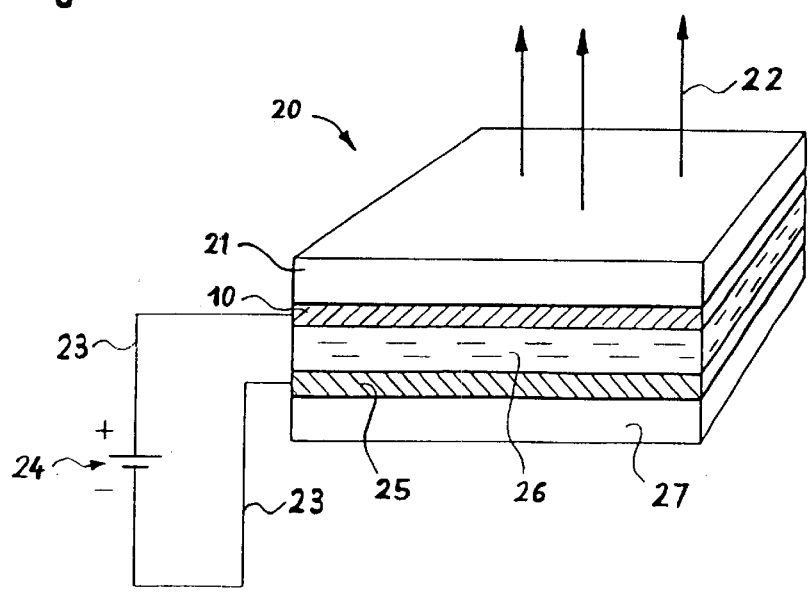
FIG. 2 is a schematic 3-dimensional view of a first embodiment; a light emitting cell with an electrode according to FIG. 1.
Figure 3:
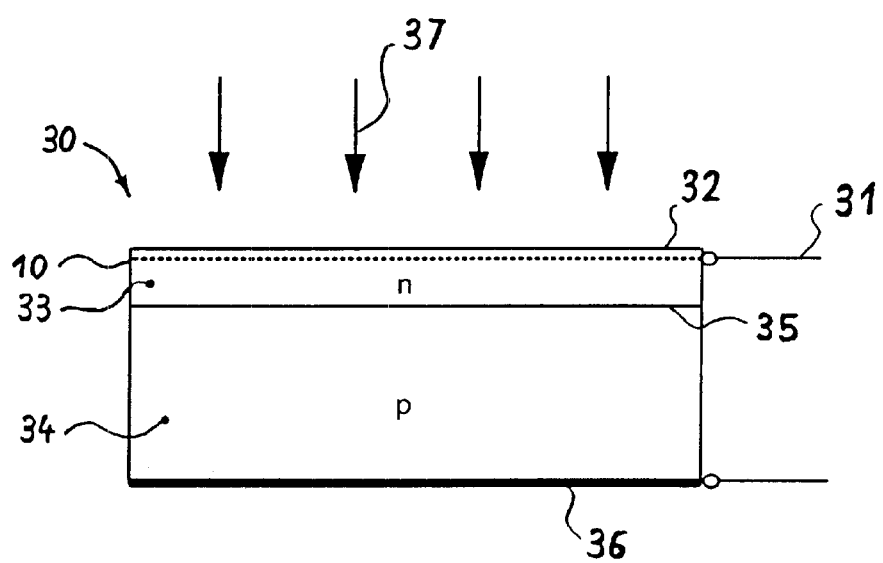
FIG. 3 is a cross-sectional view of a second embodiment; a light receiving cell (solar cell) with an electrode according to FIG. 1.

Two embodiments in accordance with the present invention are described with respect to FIGS. 1–3. The first embodiment is an OLED device with a transparent electrode which emits light and the second embodiment shows a light receiving solar cell with a transparent electrode. For the purpose of the present invention, the wavelength $\lambda$ of light is supposed to cover the range from $\lambda \approx 10$ nm to $\lambda \approx 10$ $\mu$m. It should be noted that the elements of the electrode may have any kind of structure and the word perimeter p herein used is meant to cover any kind of size or shape suited to design a transparent electrode. The fact that according to the present invention p has to be smaller than $\lambda$ is taken into consideration when designing such an electrode.

An electrode 10, shown in FIG. 1 in a schematic 3-dimensional top-view, is manufactured using microcontact printing or processing which is a special lithography technique to make submicron or nanometer features (elements). Microcontact printing is a high-resolution lithography technique based on transfer of a pattern from an elastomeric "stamp" to a solid substrate by conformal contact, which means a nanoscale interaction between substrate and stamp on macroscopic scales that allows transport of material from a stamp to substrate. The stamp is first formed by curing poly(dimethyl siloxane) (PDMS) on a master with the negative of the desired surface or structure, resulting in an elastomeric solid with a pattern of reliefs on its surface. The stamp provides an "ink" that forms a self-assembled monolayer on a solid surface by a covalent, chemical reaction, which means the protruding regions of the patterned stamp touch the substrate surface in the printing step where ink molecules are then transferred locally. Microcontact printing provides simultaneous transfer of patterns over areas without diffraction or depth-of-focus limitations. Structures in the scale of the wavelength of light can be realized with such a technique.

Referring to FIG. 1, the manufacturing of the electrode 10 is described. On a rectangular glass substrate 11 a first ITO (indium-tin-oxide) layer 12 of about 5 nm thickness is sputtered by known techniques. This layer has a resistance of about 1000 Ω/□ and serves finally as an adhesion layer. Now using the afore described microcontact printing technique, a conductive grid 13 consisting of gold (Au) with a thickness of about 50 nm is made. The conductive grid 13 comprises conductive elements or straps 14, whereby the conductive straps 14 are arranged in form of a honeycomb-like structure with spaces 15. However, the conductive straps 14 should have dimensions small compared to the wavelength of light, which means that the conductive straps 14 comprise a perimeter p smaller than the wavelength $\lambda$ of the passing light. The direction of the passing light can be influenced by the structure of the conductive grid 13, in particular the perimeter, size, shape and the geometry of the conductive straps 14 and spaces 15. Therefore the features are highly application specific for optical effects like polarization, color enhancement or viewing angle adjustments. As indicated in the upper half portion of FIG. 1 a work function modifier 16, which can be ITO to build an anode, of about 5 nm is applied by evaporation. The work function modifier 16 acts also as a diffusion barrier. Without ITO layer 12 and through substitution of work function modifier 16 with $SiO_2$ or SiN transparent leads can easily be produced. The patterning can be done for example by using photolithography and etching or shadow masking and $Sio_2$. Finally, a glass which has protecting functions may enclose the electrode 10, which for sake of clarity is not depicted.

FIG. 2 shows a schematic 3-dimensional view of a cuboid area organic light emitting diode (OLED) device 20 with an electrode 10 according to FIG. 1. A glass substrate layer 21 is situated on the top of the OLED device 20 which form the outside of the device and where the emitted light 22 emerge from the OLED device 20. Below the layer 21 the transparent electrode 10 as an anode with an electrical contact 23 to a power source 24 is placed. A counter electrode or cathode 25 may be built opposite as a transparent electrode like electrode 10, whereby in this case a full transparent OLED device 20 can be achieved. The cathode 25 also with an electrical contact 23 to the power source 24 can as well as provided by common electrodes which are normally used in such devices. Between the electrode 10 and the cathode 25 a polymer as light emitting organic layer 26 is deposited, preferably poly(p-phenylenevinylene) (PPV), which means that an organic emission layer is sandwiched between the two electrodes 10, 25 which inject electrons ($e^-$) and holes ($h^+$), respectively. There are many other organic materials known as good light emitters which can be used instead. Another glass layer 27 is applied on the bottom of the OLED device 20 which forms the backside of the device 20. Using the power source 24 to apply an electrical field between the two electrodes 10 and 25 causes the polymer 26 to emit colored light 22, which is determined by selection of the polymer, by filters, by colour converters and the geometry of the electrodes. The electrons and holes meet in the organic layer 26 and recombine producing light 22.

An OLED device may either be grown directly on a silicon (Si) substrate carrying Si devices, or it may be fabricated separately and flipped onto the Si substrate later. In this case the silicon substrate carries some metallization and would substitute the electrode 25 and the final glass layer 27.

A silicon p-n junction solar cell 30 as a further embodiment, illustrated in FIG. 3, is addressed now. An electrode 10, according to FIG. 1, is applied as a front electrode on the top of the solar cell 30. The electrode 10 with an electrical contact 31 to the outside is covered by a glass or plastic coating 32 to protect the solar cell 30 from the environment. The electrode 10 might be designed to achieve suitable angles for the incident light or to reduce or even to avoid reflections. No light penetrates usually full metal electrodes. Conventional solar cells use therefore stripe-like or finger-like full metal front contacts as electrodes. Such electrodes have the disadvantage that they totally cover certain parts of a solar cell whereas other parts of the solar cell are not covered at all. It seems to be a contradiction in terms, but nevertheless the best, e.g. highest generation rate of electron-hole pairs and therewith high yield of electricity, happens if there are two electrodes right opposite to each other. Below the electrode 10 a n-type silicon layer 33 of about ¼ $\mu$m thickness is placed on a much thicker p-type silicon layer 34. Between layer 33 and layer 34 a shallow p-n junction 35 is formed, e.g., by diffusion. An ohmic contact or a full metal contact as a rear electrode 36 with an electrical contact 31 to the outside is applied on the bottom of the solar cell 30. The complete solar cell has a thickness of about 0.5 mm. By connecting the solar cell 30 with the electrical contacts 31 to an external circuit (not shown in FIG. 3) and if light 37 is shining onto the solar cell 30, electrons are able to flow and incident solar energy 37 is directly converted into electricity or electrical energy.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A light transmitting electrode for an electro-optical device, said light transmitting electrode comprising a plurality of conductive elements arranged for transmitting light having a wavelength from 10 nm to 10 $\mu$m through said light transmitting electrode, each of said plurality of conductive elements having a cross-section perimeter smaller than a wavelength of said light, said light transmitting electrode causing more forward scattering than backward scattering of said light.

2. A light transmitting electrode according to claim 1, wherein said plurality of conductive elements causes Mie scattering to occur.

3. The light transmitting electrode according to claim 1, wherein said light transmitting electrode has a topside modifier and/or a backside modifier.

4. The light transmitting electrode according to claim 1, wherein said light transmitting electrode is manufactured using a technique selected from the group consisting of: microcontact processing, photolithography, thermal evaporation, sputtering, coating, etching and combinations thereof.

5. The light transmitting electrode according to claim 1, wherein said light transmitting electrode is a conductor or a conductor element.

6. The light transmitting electrode according to claim 1, wherein said plurality of conductive elements are longitudinally arranged in a periodic pattern.

7. The light transmitting electrode according to claim 6, wherein said pattern of said plurality of conductive elements determines a direction of said light.

8. The light transmitting electrode according to claim 1, wherein said plurality of conductive elements has a surface coverage of about 1% to 20% of said light transmitting electrode and said light transmitting electrode has a resistance of about 0.01 Ω/□ to 100 Ω/□.

9. The light transmitting electrode according to claim 8, wherein said plurality of conductive elements has a surface coverage of smaller than 10% of said light transmitting electrode.

10. The light transmitting electrode according to claim 8, wherein said electrode has a resistance of less than 1 Ω/□.

11. An electro-optical device emitting light, said electro-optical device comprising a light transmitting electrode, said light transmitting electrode comprising a plurality of conductive elements arranged for transmitting light having a wavelength from 10 nm to 10 μm through said light transmitting electrode, each of said plurality of conductive elements having a perimeter smaller than a wavelength of said light, said light transmitting electrode causing more forward scattering than backward scattering of said light.

12. An electro-optical device receiving light, said electro-optical device comprising a light transmitting electrode, said light transmitting electrode comprising a plurality of conductive elements arranged for transmitting light having a wavelength from 10 nm to 10 μm through said light transmitting electrode, each of said plurality of conductive elements having a perimeter smaller than a wavelength of said light, said light transmitting electrode causing more forward scattering than backward scattering of said light.

* * * * *